(12) United States Patent
Chen

(10) Patent No.: US 10,854,559 B2
(45) Date of Patent: Dec. 1, 2020

(54) METHODS AND MODULES RELATED TO SHIELDED LEAD FRAME PACKAGES

(71) Applicant: SKYWORKS SOLUTIONS, INC., Woburn, MA (US)

(72) Inventor: Howard E. Chen, Anaheim, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 16/458,011

(22) Filed: Jun. 29, 2019

(65) Prior Publication Data

US 2020/0161254 A1 May 21, 2020

Related U.S. Application Data

(63) Continuation of application No. 16/029,589, filed on Jul. 7, 2018, now Pat. No. 10,340,225, which is a
(Continued)

(51) Int. Cl.
*H01L 23/552* (2006.01)
*H01L 23/495* (2006.01)
(Continued)

(52) U.S. Cl.
CPC ...... *H01L 23/552* (2013.01); *H01L 21/32051* (2013.01); *H01L 21/4825* (2013.01); *H01L 23/3114* (2013.01); *H01L 23/4952* (2013.01); *H01L 23/49531* (2013.01); *H01L 23/49541* (2013.01); *H01L 23/66* (2013.01); *H01Q 1/243* (2013.01); *H01Q 1/48* (2013.01); *H04B 15/00* (2013.01); *H01L 21/568* (2013.01); *H01L 23/49548* (2013.01); *H01L 24/16* (2013.01); *H01L 24/48* (2013.01); *H01L 2223/6677* (2013.01); *H01L 2224/16245* (2013.01); *H01L 2224/45099* (2013.01); *H01L 2224/48091* (2013.01); *H01L 2224/48245* (2013.01); *H01L 2224/48247* (2013.01); *H01L 2924/00014* (2013.01); *H01L 2924/1421* (2013.01); *H01L 2924/15311* (2013.01); *H01L 2924/18165* (2013.01); *H01L 2924/19041* (2013.01);
(Continued)

(58) Field of Classification Search
CPC .................................................. H01L 23/552
USPC .......................................................... 257/659
See application file for complete search history.

(56) References Cited

U.S. PATENT DOCUMENTS 4,012,723 A * 3/1977 Harper .................... G04G 17/02
365/2
4,677,526 A * 6/1987 Muehling ........... H01L 21/4839
174/529

(Continued)

*Primary Examiner* — Jami Valentine Miller
(74) *Attorney, Agent, or Firm* — Chang & Hale LLP

(57) ABSTRACT

Devices and methods are disclosed, related to shielding and packaging of radio-frequency (RF) devices on substrates. In some embodiments, a method for providing electro-magnetic interference shielding for a radio-frequency module can include applying a metal-based covering over a portion of a lead-frame package, the package having a plurality of pins with at least one pin exposed from overmold compound and in contact with the metal-based covering. The method can also include mounting the lead-frame package on a substrate. The method can further include connecting the metal-based covering to a ground plane of the substrate.

20 Claims, 8 Drawing Sheets

Related U.S. Application Data continuation of application No. 15/382,688, filed on Dec. 18, 2016, now Pat. No. 10,043,763.

(60) Provisional application No. 62/269,973, filed on Dec. 19, 2015.

(51) Int. Cl.
| | |
|---|---|
| *H01L 23/31* | (2006.01) |
| *H01L 21/3205* | (2006.01) |
| *H01L 21/48* | (2006.01) |
| *H01L 23/66* | (2006.01) |
| *H01Q 1/48* | (2006.01) |
| *H01Q 1/24* | (2006.01) |
| *H04B 15/00* | (2006.01) |
| *H01L 23/00* | (2006.01) |
| *H01L 21/56* | (2006.01) |

(52) U.S. Cl.
CPC ............ *H01L 2924/19042* (2013.01); *H01L 2924/19105* (2013.01); *H01L 2924/3025* (2013.01)

(56) References Cited

U.S. PATENT DOCUMENTS

| | | | |
|---|---|---|---|
| 9,704,812 B1* | 7/2017 | Lam | H01L 23/49513 |
| 2007/0090502 A1* | 4/2007 | Zhao | H01L 23/4334 |
| | | | 257/675 |
| 2007/0278632 A1* | 12/2007 | Zhao | H01L 23/4334 |
| | | | 257/676 |
| 2012/0223429 A1* | 9/2012 | Khan | H01L 23/552 |
| | | | 257/738 |
| 2016/0020177 A1* | 1/2016 | Tam | H01L 24/97 |
| | | | 257/659 |

* cited by examiner

METHODS AND MODULES RELATED TO SHIELDED LEAD FRAME PACKAGES

CROSS-REFERENCE TO RELATED APPLICATION(S)

This application is a continuation of U.S. patent application Ser. No. 16/029,589, filed Jul. 7, 2018, entitled "METHODS AND MODULES RELATED TO SHIELDED LEAD FRAME PACKAGES," which is a continuation of U.S. patent application Ser. No. 15/382,688, filed Dec. 18, 2016, entitled "SHIELDED LEAD FRAME PACKAGES," which claims priority to U.S. Provisional Application No. 62/269,973, filed Dec. 19, 2015, entitled "SHIELDED LEAD FRAME PACKAGES," the disclosure of each of which is hereby expressly incorporated by reference herein in its entirety.

BACKGROUND

Field

The present disclosure relates to packaging structures and techniques for shielding electronic devices, particularly from electromagnetic interference.

Description of the Related Art

Electromagnetic (EM) fields can be generated from or have an undesirable effect on a region of a radio-frequency (RF) device such as an RF module. Such an EM interference (EMI) can degrade the performance of wireless devices that use such an RF module. Some RF modules can be provided with EM shields to address such performance issues associated with EMI.

SUMMARY

In some implementations, the present disclosure relates to a radio-frequency (RF) module comprising a lead-frame package with a plurality of pins and at least one pin exposed from overmold compound, and a metal-based covering over a portion of the lead-frame package, the metal-based covering in contact with the at least one pin.

In some embodiments, the module is mounted to a substrate, and the metal-based covering is connected to a ground plane within the substrate. In some embodiments, the at least one pin is soldered to a ground connection on the substrate, to connect the metal-based covering to the ground plane.

In some embodiments, the portion of the lead-frame package covered by the metal-based covering includes all but one side of the lead-frame package. In some embodiments, the metal-based covering includes two or more layers of metal. In some embodiments, at least one layer of the two or more layers includes a first metallic composition that differs from a second metallic composition of another layer of the two or more layers.

In some embodiments, the lead-frame package has an inner row and an outer row of pins on each side, and all the pins of all the outer rows of pins are assigned to ground. In some embodiments, the lead-frame package includes a semiconductor die and none of the pins of the outer rows of pins are electrically connected to the semiconductor die.

In some embodiments, the metal-based covering is applied by spraying metallic paint on the lead-frame package.

In some embodiments, the present disclosure includes a method for providing electro-magnetic interference (EMI) shielding for a radio-frequency (RF) module, including applying a metal-based covering over a portion of a lead-frame package, the package having a plurality of pins with at least one pin exposed from overmold compound and in contact with the metal-based covering, mounting the lead-frame package on a substrate, and connecting the metal-based covering to a ground plane of the substrate.

In some embodiments, the method further includes removing metal buildup of the metal-based covering from at least one section of one side of the lead-frame package.

In some embodiments, the method further includes performing a post-mounting processing step on the lead-frame package after mounting the lead-frame package on a substrate.

In some embodiments, applying the metal-based covering includes spraying metallic paint on the lead-frame package.

In some embodiments, the method further includes connecting the metal-based covering to the ground plane includes soldering the at least one pin to a ground connection on the substrate.

In some embodiments, the portion of the lead-frame package covered by the metal-based covering includes all but one side of the lead-frame package. In some embodiments, the metal-based covering includes two or more layers of metal. In some embodiments, at least one layer of the two or more layers includes a first metallic composition that differs from a second metallic composition of another layer of the two or more layers.

In some embodiments, the lead-frame package has an inner row and an outer row of pins on each side, and all the pins of all the outer rows of pins are assigned to ground. In some embodiments, the lead-frame package includes a semiconductor die and none of the pins of the outer rows of pins are electrically connected to the semiconductor die.

In some embodiments, the present disclosure relates to a wireless device including an antenna and a module in communication with the antenna, the module configured to provide electro-magnetic interference shielding for a lead-frame package, the module including a lead-frame package having a plurality of pins with at least one pin exposed from overmold compound, the module further including a metal-based covering over a portion of the package, the metal-based covering in contact with the at least one pin.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed are devices and methods for providing radio-frequency (RF) isolation or shielding for an active or a passive RF device. For the purpose of description, it will be understood that RF can include electromagnetic signals having a frequency or a range of frequencies associated with wireless devices. RF can also include electromagnetic signals that radiate within an electronic device, whether or not such an electronic device operates as a wireless device. RF can also include signals or noises typically associated with electromagnetic interference (EMI) effects.

For the purpose of description it will be understood that such an RF device can include a device configured to operate at an RF range to facilitate transmitting and/or receiving of RF signals, and a device that can influence another device by, or be influenced by, RF signals or noises. Non-limiting examples of such an RF device can include a semiconductor die with or without an RF circuitry. Non-limiting examples of such an RF-related device can include discrete devices such as inductors and capacitors, and even a length of a conductor.

For the purpose of description, it will be understood that the terms isolation and shielding can be used interchangeably, depending on the context of usage. For example, an RF device being shielded can include a situation where an RF signal from another source is being partially or fully blocked. In another example, an RF device being isolated can include a situation where an RF signal (e.g., noise or actively generated signal) is being partially or fully blocked from reaching another device. Unless the context of usage specifically states otherwise, it will be understood that each of the terms shielding and isolation can include either or both of the foregoing functionalities.

Portable electronic devices, such as cell phones, typically utilize multi-component semiconductor modules to provide a high level of circuit integration in a single molded package. The multi-component semiconductor module can include, for example, a semiconductor die and a number of electronic components, which are mounted on a circuit board. The circuit board including the semiconductor die and electronic components can be encapsulated in a molding process to form an overmolded semiconductor package. To ensure an acceptable level of performance in devices such as cell phones, which are required to properly operate in diverse environments, the overmolded semiconductor package must be shielded from Electro-Magnetic Interference (EMI), which includes Radio Frequency Interference (RFI). However, semiconductor device manufacturers are challenged to provide effective EMI shielding for an overmolded semiconductor package without increasing the size of the package and without substantially increasing packaging cost.

Figure 1A:
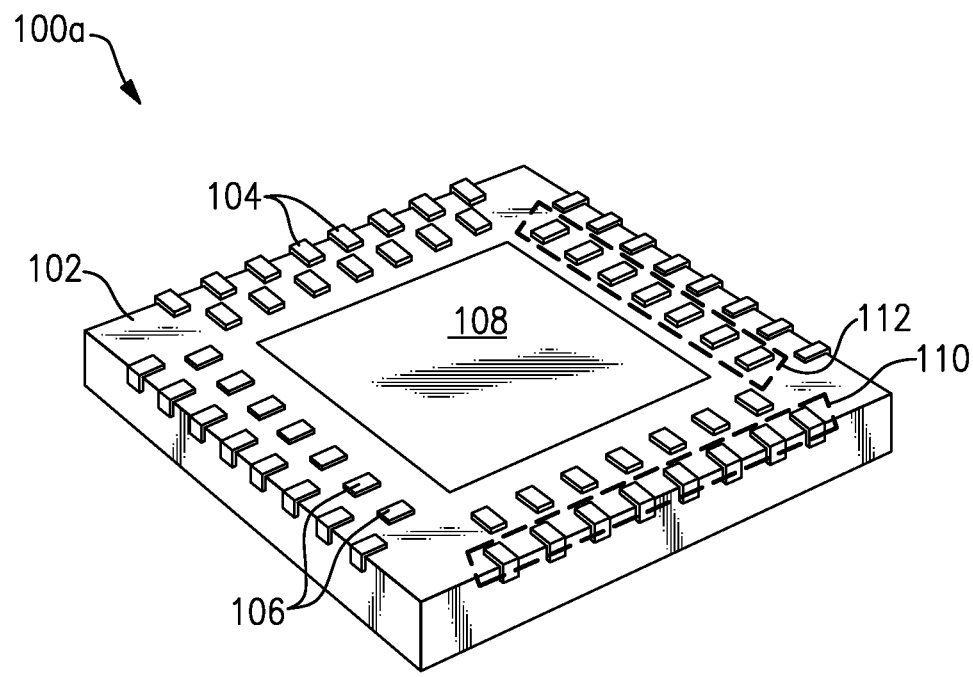
FIG. 1A shows a perspective view of the bottom of an unshielded semiconductor device, in accordance with some implementations.

FIG. 1A provides a perspective view of the bottom of an unshielded semiconductor device 100a (or package), where the device 100a is not substantially shielded from electromagnetic interference (EMI). In some embodiments, the unshielded device 100a is a dual-row, quadrature, flat no-lead (QFN) chip package. The unshielded device 100a shown in FIG. 1A includes a semiconductor chip (not shown), a thermal pad 108 in contact with the semiconductor chip, inner pins 106 of one or more inner rows 112, and outer pins 104 of one or more outer rows 110, held together by overmold compound 102. Pins 106 and/or 104 may alternatively be referred to as leads or contact pads. FIG. 1A also shows that in some embodiments, outer pins 104 of the one or more outer rows 110 have more exposure from overmold compound 102 than inner pins 106 of one or more inner rows 112. The QFN chip package shown as semiconductor device 100a is one example of an unshielded semiconductor device 100a, however one skilled in the art will appreciate that alternative package structures, pad arrangements and pad locations are possible. For example, semiconductor device 100a may have a single row of pins per side, or more than two rows of pins per side.

In some embodiments, the unshielded device 100a of FIG. 1A is an unshielded RF module. In some embodiments, the semiconductor chip of device 100a is a die having an integrated circuit (IC) such as an RF circuit. In some embodiments, the unshielded device 100a includes a plurality of semiconductor chips, die, integrated circuits and/or modules. In some embodiments, device 100a can include, for example, a die having one or more switching circuits. Die having other types of RF circuits can also be utilized. In some embodiments, such a switching die can include a silicon-on-insulator (SOI) die. Other types of process technologies can also be implemented. As described herein, a substrate may be a ceramic substrate and can include, for example a low-temperature co-fired ceramic (LTCC) substrate, a high-temperature co-fired (HTCC) substrate, or other types of ceramic materials and/or configurations.

Figure 1B:
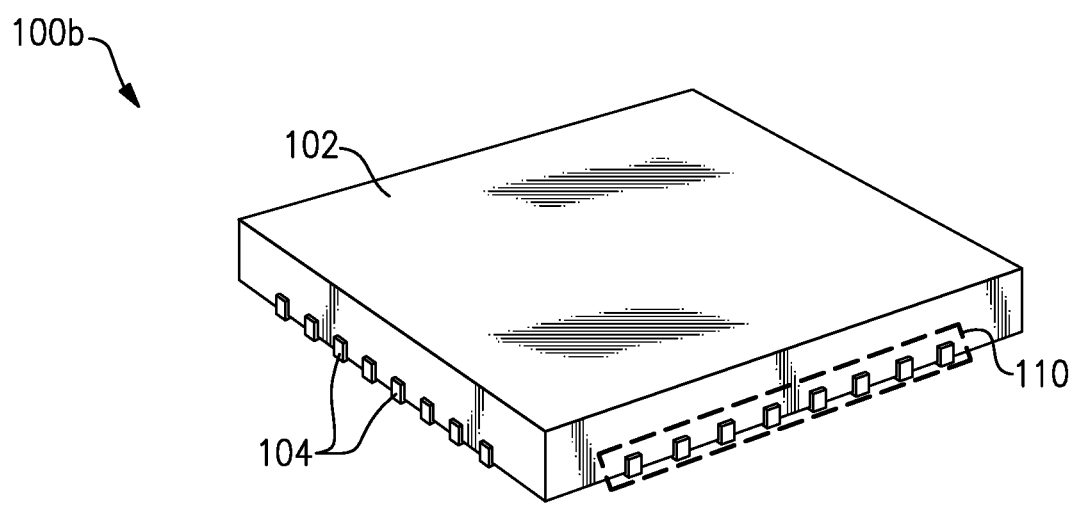
FIG. 1B, shows a perspective view of the top of the same unshielded semiconductor device of FIG. 1A, in accordance with some implementations.

FIG. 1B, provides a perspective view 100b of the top of the same unshielded semiconductor device 100a of FIG. 1A, where the device is flipped over by 180 degrees. FIG. 1B illustrates that in some embodiments, the outer pins 104 are exposed from overmold compound 102 along the sides of the semiconductor device. In some embodiments, the exposed portions of the outer pins 104 of the semiconductor device extend up from the bottom side of the device (e.g., as shown in FIG. 1A), along one or more sides of the device.

Figure 2A:
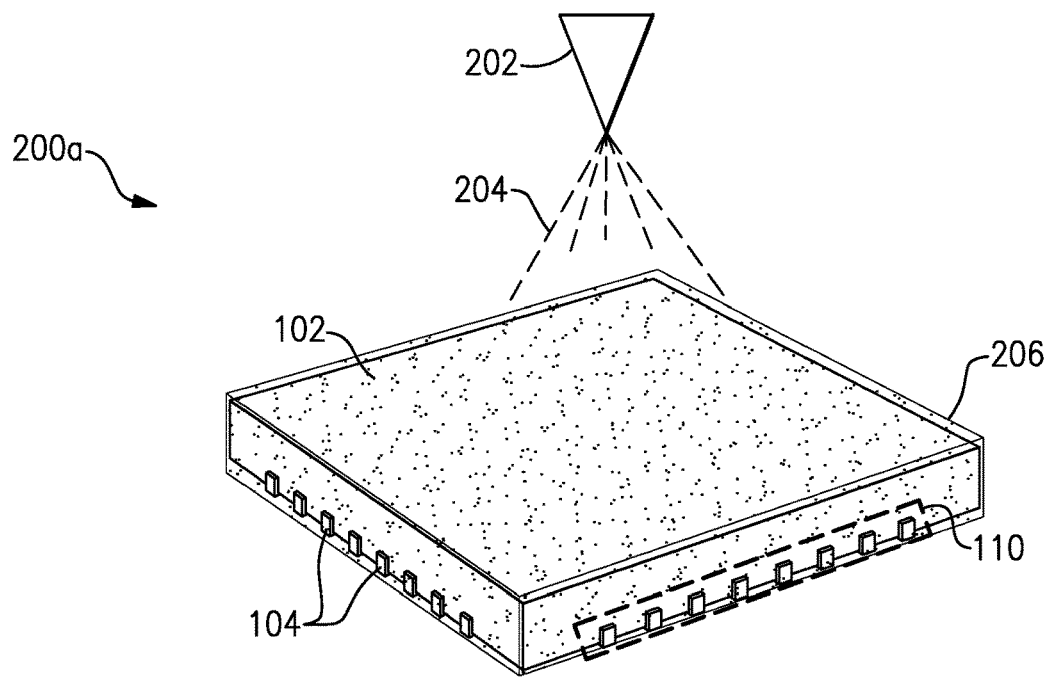
FIG. 2A shows an example of application of a metal-based covering over an unshielded semiconductor device, in accordance with some implementations.

FIG. 2A shows an example of application of a metal-based covering 206 over the unshielded semiconductor device 100a of FIGS. 1A and 1B, to create an EMI-shielded semiconductor device 200a. In some embodiments, the application of the metal-based covering 206 is performed by spraying or sputtering a metallic paint 204 from an applicator 202. As shown in FIG. 2A, the metal-based covering 206 covers all or substantially all of the top of semiconductor device 200a and the sides of device 200a, including covering some or all of the exposed portions of outer pins 104. In some embodiments, the metal-based covering 206 provides greater electromagnetic interference (EMI) shielding for semiconductor device 200a if the metal-based covering 206 is connected to ground (e.g., after package 200a is mounted on a ceramic substrate). In some embodiments, metal-based covering 206 covering the side edges of the ceramic substrate are in electrical contact with one or more conductive layers within the ceramic substrate and extend to their respective edges of the ceramic substrate. Thus, combined with the ground plane (in electrical contact with conductive layers of the ceramic substrate), the metal-based covering 206 provides shielding functionality for the packaged device.

One or more metal layers can be formed by utilizing a screen printing process, spraying process, electroplating process, thermal spray deposition process, or other suitable process to apply a layer of conductive ink on a top surface of overmold 102 and on the sides of semiconductor device 200a. In an embodiment in which metal-based covering 206 comprises a layer of metal, the layer of metal can be deposited on the top and sides of device 200a by utilizing a chemical vapor deposition (CVD) process or other suitable deposition processes.

EMI shielding for devices or modules is desired in many circuit board designs, to guard sensitive components from unwanted emissions of electromagnetic or radio frequencies. EMI shielding serves to protect semiconductor devices such as device 200a from RF emissions from other components mounted in close proximity to each other on a common substrate, and it serves to protect neighboring components from possible RF emissions from device 200a.

In some embodiments, metal-based covering 206 comprises more than one layer of material. In some embodiments, metal-based covering 206 comprises a three-layer coating of alternating metals. For example, a tri-layer metal-based coating includes a first layer of stainless steel or titanium, a second layer of copper and a third layer of stainless steel or titanium. In some embodiments, each layer of a multi-layer metal-based covering 206 is applied by sputtering or spraying a metallic paint 204 on the semiconductor device 200a. For example, a first layer of titanium is sprayed on all or substantially all but the bottom of an unshielded semiconductor device 200a, then a second layer of copper is sprayed on all or substantially all but the bottom of device 200a, and finally a third layer of titanium is sprayed over all or substantially all but the bottom of device 200a. In some embodiments, metal-based covering 206 is formed to cover all or substantially all of the exposed surfaces of pins 104 in one or more outer rows 110, along the sides of an unshielded semiconductor device. In some embodiments, the unshielded semiconductor device (e.g., device 200a) is adhered to a film or tape-like structure to protect the bottom of the device from the application of the metal-based covering 206. In some embodiments, the film or tape-like structure is removed after the application of the metal-based covering 206.

Although FIG. 2A illustrates a single package 200a, in some embodiments, application of metallic paint 204 to form metal-based covering 206 can be performed on a plurality of semiconductor devices or packages, as part of an automated manufacturing process. In some embodiments, this can be performed before individual singulation of the plurality of semiconductor devices or packages. In some embodiments, application of metallic paint 204 can be performed on an unshielded semiconductor device already mounted to a substrate.

Figure 2B:
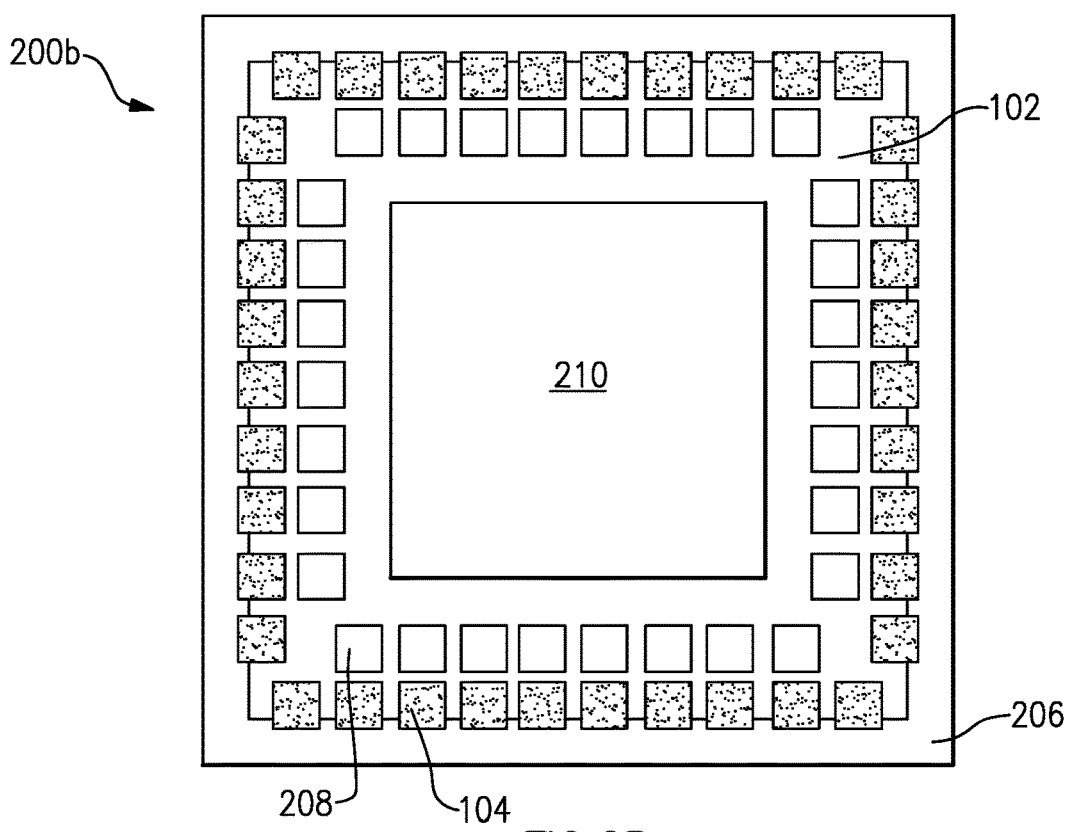
FIG. 2B shows a bottom view of a shielded semiconductor device, in accordance with some implementations.

FIG. 2B illustrates a bottom view of a shielded semiconductor device 200b. In comparison to the unshielded device of FIG. 1A, in FIG. 2B, metal-based covering 206 surrounds one or more rows of outer pins 104 and one or more rows of inner pins 208, held together with chip 210 by overmold compound 102. FIG. 2B illustrates that metal-based covering 206 electrically connects all the outer pins 104 with each other and to metal-based covering 206. In some embodiments, chip 210 is an exposed surface of a semiconductor die, and in some embodiments, chip 210 is a thermal pad in contact with a semiconductor die. For ease of explanation, chip 210 will be understood, in some embodiments, to encompass additional components to a semiconductor die but will hereinafter be referred to as chip 210.

FIG. 2B illustrates that outer pins 104 (shown in gray), are shorted or electrically connected to one another and to metal-based covering 206. In some embodiments, chip 210 has a semiconductor die with a plurality of pins, pads or solder balls, each connected to one or more of outer pins 104 or inner pins 208. In some embodiments, the semiconductor die has a plurality of signal pins, pads or solder balls connected solely to one or more of inner pins 208 and none of outer pins 104, to avoid shorting any circuitry of the die to components involved in providing EMI shielding for the semiconductor device. In some embodiments, one or more pins, pads or solder balls of the semiconductor die are assigned to ground and are connected to one or more of outer pins 104. For example, if a design results in too few inner pins 208 to allow for adequate connections to the pins, pads or solder balls of the semiconductor die, a few noise-tolerant ground connections are made from the semiconductor die to outer pins 104 to free up one or more inner pins 208.

Figure 3A:
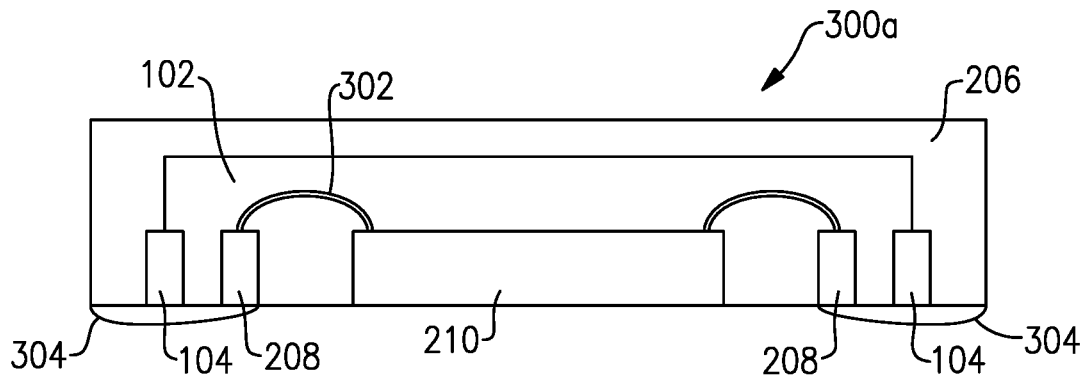
FIG. 3A shows a shielded semiconductor device 300a with a buildup of metal-based material on the bottom of a shielded device, in accordance with some implementations.

FIGS. 3A to 3D illustrate cross-sectional views of non-limiting examples of various processing stages of the shielded semiconductor devices of FIGS. 2A and 2B, after application of the metal-based covering 206. The examples shown in FIGS. 3A to 3D illustrate wire-bonded connections between chip 210 (or a semiconductor die of chip 210), and inner pins 208. However, as described above, in some embodiments wire-bond connections 302 are made to one or more outer pins 104 as well, or another packaging solution such as flip-chip, is used instead of wire-bonding. FIG. 3A illustrates that in some embodiments, after application of the metal-based material of covering 206, the shielded semiconductor device 300a results in having a buildup 304 of the same metal-based material on the bottom of device 300a. In some embodiments, as shown in FIG. 3A, buildup 304 is extensive enough to cover at least a portion of outer pins 104 and/or inner pins 208, on the bottom of device 300a.

Figure 3B:
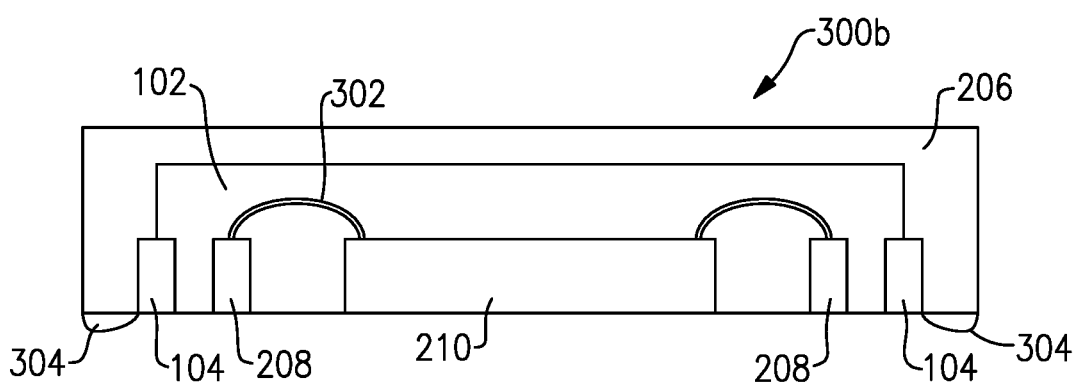
FIG. 3B shows a cross-section of a shielded semiconductor device with at least some buildup removed or reduced from that shown in FIG. 3A, in accordance with some implementations.

FIG. 3B illustrates an example cross-section of a shielded semiconductor device 300b with at least some of buildup 304 removed or reduced from that shown in FIG. 3A. In some embodiments, buildup 304 can be removed by utilizing a laser abrasion process, a mechanical milling process, a diamond polish process, or other suitable process. In some embodiments, reduction or elimination of buildup 304 from at least the surfaces of inner pins 208 and outer pins 104 on the bottom of device 300b, involves application of energy, a chemical or some force. For example, buildup 304 is reduced or eliminated by applying heat, UV light or a focused ion beam (FIB) to ablate some or all of buildup 304. In another example, a chemical solvent or plasma is applied to the bottom of semiconductor device 300a of FIG. 3A, to eat away at some or all of the metal of buildup 304. In another example, a physical etching of buildup 304 is performed by grinding or picking away the metal of buildup 304. In some embodiments, a combination of applying energy, chemicals or force, is performed to reduce or eliminate buildup 304. In some embodiments, as shown in FIG. 3B, some buildup 304 is intentionally left behind to provide greater EMI shielding for device 300b.

Figure 3C:
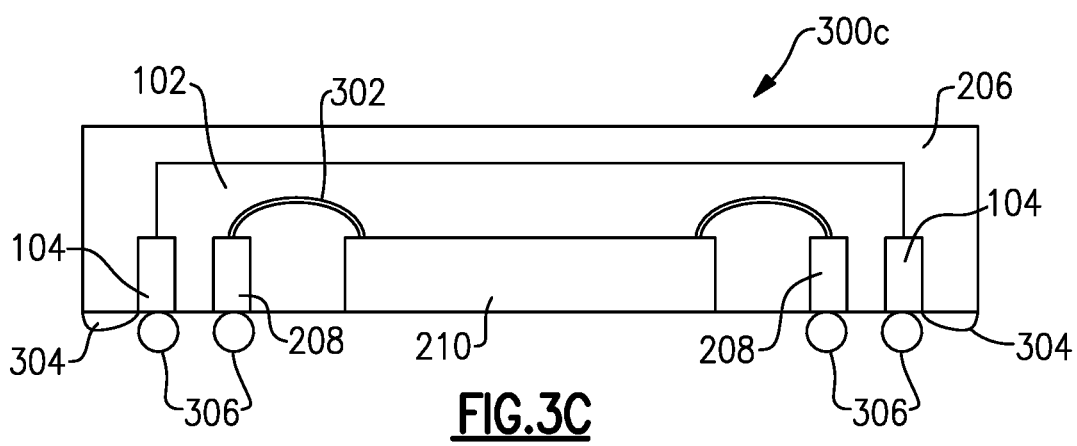
FIG. 3C shows a cross-section of a shielded semiconductor device in an intermediate stage of being soldered to a printed circuit board or substrate, in accordance with some implementations.

FIG. 3C illustrates an example cross-section of a shielded semiconductor device 300c in an intermediate stage of being soldered to a printed circuit board or substrate. In this non-limiting example, one or more inner pins 208 and/or one or more outer pins 104 have an electrically conductive adhesive such as solder 306, applied to them. In this example, solder balls 306 are applied to the exposed surfaces of pins 104 and 208, however, in some embodiments, solder 306 is applied to the printed circuit board or substrate in addition, or alternatively.

Figure 3D:
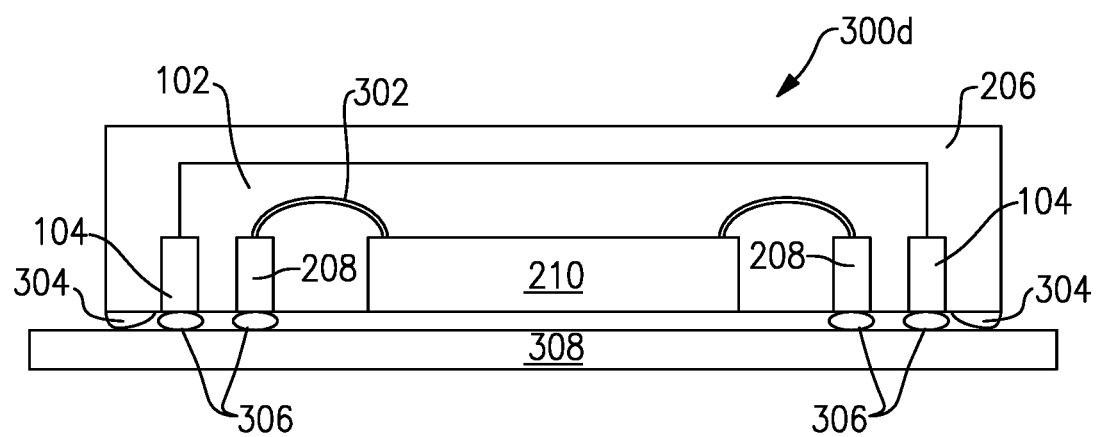
FIG. 3D shows a cross section of a shielded semiconductor device soldered or adhered to a substrate, in accordance with some implementations.

FIG. 3D illustrates an example cross section of a shielded semiconductor device 300d soldered or adhered to a substrate 308 (e.g., a printed circuit board). In some embodiments, to provide effective EMI shielding, one or more of the outer pins 104, in contact with metal-based covering 206, are connected to a ground plane of substrate 308. In some embodiments, every outer pin 104 is connected to a ground plane of substrate 308, and in some embodiments they are connected to the same ground plane. In some embodiments, such as described above when one or more pins, pads or solder balls of chip 210 are tied to one or more outer pins 104, some of outer pins 104 are tied to a different ground plane or ground connection of substrate 308.

In some embodiments, a shielded semiconductor device can have a post-mounting process performed on it. In a non-limiting example, a heat dissipation device, is applied over metal-based covering 206. In some embodiments, a post-mounting processing operation is performed to increase the EMI shielding capability of semiconductor device 300d. For example, if there is a gap between metal-based covering 206 and substrate 308, additional metal or another material is added to fill in that gap, or alternatively, heat is applied to some or all of metal-based covering 206 to allow some material to flow into and fill the gap. In some embodiments, an unshielded semiconductor device (e.g., as shown in FIG. 1A) is mounted to substrate 308 and one or more steps are performed to generate and/or apply metal-based covering 206 on the mounted, unshielded semiconductor device.

Figure 4A:
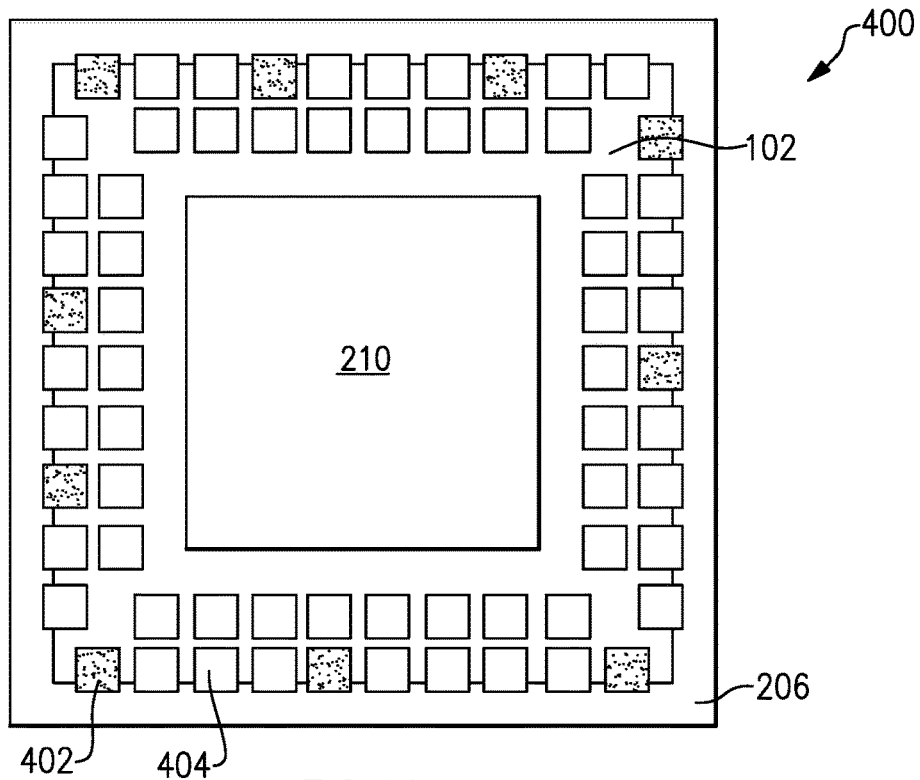
FIG. 4A provides a bottom view of a shielded semiconductor device with an alternative grounding topology, in accordance with some implementations.

FIG. 4A provides a bottom view of a shielded semiconductor device 400 and illustrates an alternative grounding topology for the shielded semiconductor device 400 from that shown and described with respect to FIG. 2B. In this non-limiting example, outer ground pins 402 (shown in gray) are connected to a ground plane of a substrate and optionally also to chip 210, while outer unconnected pins 404 (shown in white) are left disconnected from the substrate and chip 210. However, one skilled in the art will appreciate that all the outer pins 402 and 404 are electrically connected with each other and with metal-based covering 206. This non-limiting example illustrates that the disclosed technique of providing EMI shielding for a semiconductor device does not require any knowledge of the actual connectivity of particular outer pins 402 to a chip 210 or a substrate, as long as it can be assumed that all outer pins 402 are safe to electrically connect.

Figure 4B:
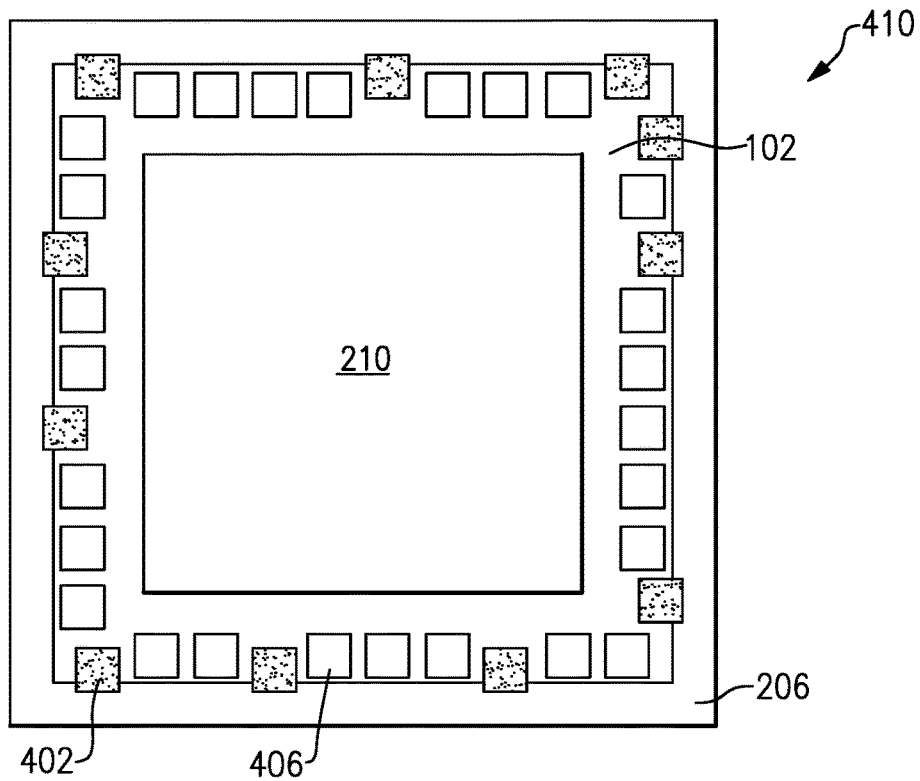
FIG. 4B provides a bottom view of a shielded semiconductor device with an alternative grounding topology, in accordance with some implementations.

FIG. 4B provides a bottom view of a shielded semiconductor device 410 and illustrates an alternative grounding topology for the shielded semiconductor device 410 from that shown and described with respect to FIG. 2B and FIG. 4A. In this non-limiting example, outer ground pins 402 (shown in gray) are connected to a ground plane of a substrate and optionally also to chip 210, while pins 406 (shown in white) are either left disconnected from the substrate and/or chip 210 or are connected to signal pins, pads or solder balls of chip 210 and corresponding signal connections on the substrate. This non-limiting example illustrates that the disclosed technique of providing EMI shielding for a semiconductor device does not require any knowledge of the actual connectivity of particular outer pins 402 to a chip 210 or a substrate, as long as it can be assumed that all outer pins 402 are safe to electrically connect.

Figure 5:
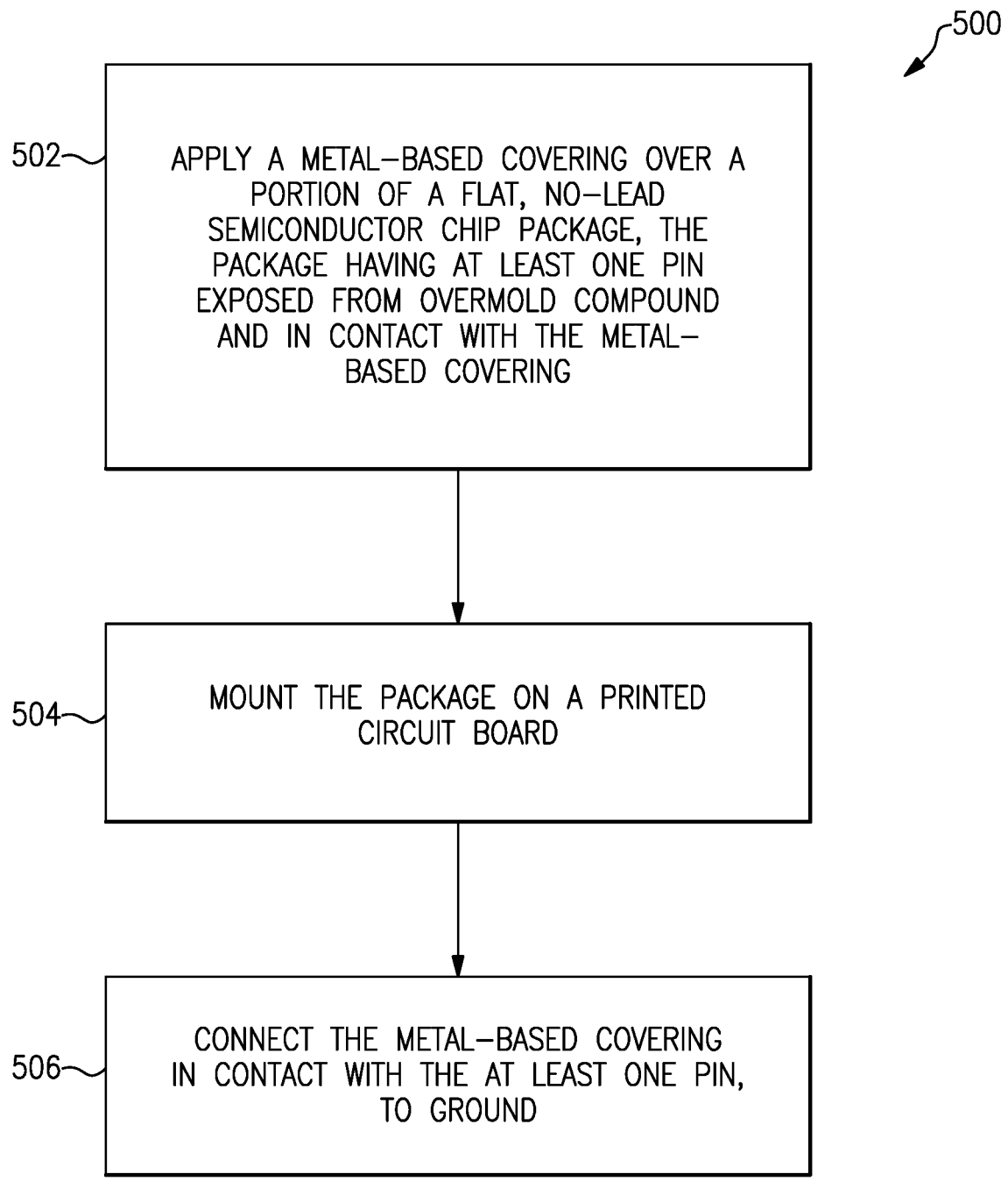
FIG. 5 is a flow chart of a process that can be implemented to provide EMI shielding for a semiconductor device, in accordance with some implementations.

FIG. 5 illustrates a process 500 that can be implemented to provide EMI shielding for a semiconductor device (e.g., device 200b) having one or more features as described herein. In some embodiments, an unshielded semiconductor device, as described herein, is adhered to a film or a tape to prevent build-up of shielding material (e.g., a metal-based coating) on the bottom of the device. In block 502, a metal-based covering can be applied over a portion of a flat, no-lead semiconductor chip package (e.g., a QFN shown in FIG. 1A), or a lead-frame package, where the package has at least one pin exposed from overmold compound and is in contact with the metal-based covering. For example, as shown and described with respect to FIG. 2A, metal-based covering 206 is applied over all or substantially all of the top and sides of a semiconductor device with one or more pins 104 exposed from overmold compound 102 along the sides of the semiconductor device. In some embodiments, the metal-based covering is in contact with at least one pin exposed from overmold compound on two or more surfaces of the pin. For example, a respective pin 104, in FIG. 2A is exposed from overmold compound 102 on the bottom of the semiconductor device as well as on a respective side of the device.

In some embodiments, the metal-based covering is sprayed or sputtered onto the semiconductor chip package. In some embodiments, the metal-based covering comprises more than one metal layer, and a respective metal layer may include the same or a distinct metal from another metal layer. In some embodiments, the metal-based covering covers substantially all but one side of the package. For example, as shown in FIG. 2A, metal-based covering 206 covers all or substantially all of the top and sides of the semiconductor device. In some embodiments, after application of the metal-based covering, the shielded semiconductor chip package has a protective tape or film removed from the bottom of the package to expose one or more pins for mounting to a board.

In block 504 of method 500, the semiconductor chip package with the metal-based covering applied over it, is mounted to a substrate or a printed circuit board. In block 506 of method 500, the semiconductor chip package with the metal-based covering is connected to ground. For example, as shown in FIGS. 3C and 3D, a semiconductor device 300d is mounted to substrate 308 and one or more pins are connected to signals and ground planes of substrate 308 via solder balls 306. In some embodiments, connecting the metal-based covering to ground includes soldering one or more outer pins of the package to a ground plane of the printed circuit board or substrate.

Figure 6:
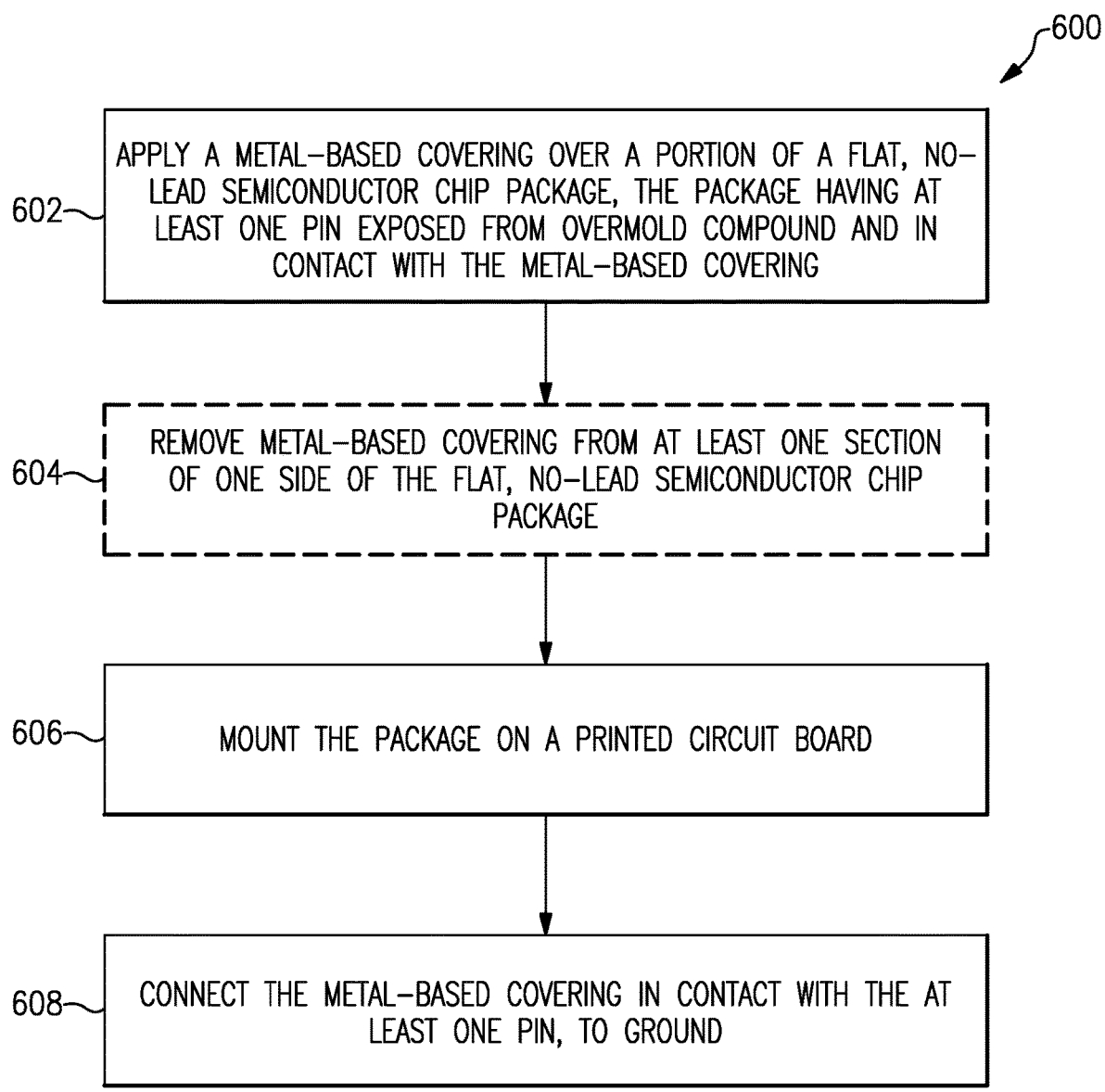
FIG. 6 is a flow chart of another process that can be implemented to provide EMI shielding for a semiconductor device, in accordance with some implementations.

FIG. 6 illustrates another process 600 that can be implemented to provide EMI shielding for a semiconductor device (e.g., device 200b) having one or more features as described herein. In some embodiments, an unshielded semiconductor device, as described herein, is adhered to a film or a tape to prevent build-up of shielding material (e.g., a metal-based coating) on the bottom of the device. Unfortunately, build-up of material can occur despite this protective measure. In block 602, a metal-based covering can be applied over a portion of a flat, no-lead semiconductor chip package (e.g., a QFN shown in FIG. 1A), or a lead-frame package, where the package has at least one pin exposed from overmold compound and is in contact with the metal-based covering. For example, as shown and described with respect to FIG. 2A, metal-based covering 206 is applied over all or substantially all of the top and sides of a semiconductor device with one or more pins 104 exposed from overmold compound 102 along the sides of the semiconductor device. In some embodiments, the metal-based covering is in contact with at least one pin exposed from overmold compound on two or more surfaces of the pin. For example, a respective pin 104, in FIG. 2A is exposed from overmold compound 102 on the bottom of the semiconductor device as well as on a respective side of the device.

In some embodiments, the metal-based covering is sprayed or sputtered onto the semiconductor chip package. In some embodiments, the metal-based covering comprises more than one metal layer, and a respective metal layer may include the same or a distinct metal from another metal layer. In some embodiments, the metal-based covering covers substantially all but one side of the package. For example, as shown in FIG. 2A, metal-based covering 206 covers all or substantially all of the top and sides of the semiconductor device. In some embodiments, the metal-based covering is a pre-formed cap or cover, applied and adhered to the package. In some embodiments, after application of the metal-based covering, the shielded semiconductor chip package has a protective tape or film removed from the bottom of the package to expose one or more pins for mounting to a board.

In block 604, in some embodiments, method 600 includes removing the material of the metal-based covering from at least one section of one side of the package. For example, as shown in FIGS. 3A and 3B, some of buildup 304 is removed from the bottom of shielded semiconductor device 300a. In some embodiments this removal of material includes application of energy such as heat, application of chemicals or a material such as a plasma wash, and/or application of force such as a physical etching away of buildup material.

In block 606 of method 600, the semiconductor chip package with the metal-based covering applied over it, is mounted to a substrate or a printed circuit board. In block 608 of method 600, the semiconductor chip package with the metal-based covering is connected to ground. For example, as shown in FIGS. 3C and 3D, a semiconductor device 300d is mounted to substrate 308 and one or more pins are connected to signals and ground planes of substrate 308 via solder balls 306. In some embodiments, connecting the metal-based covering to ground includes soldering one or more outer pins of the package to a ground plane of the printed circuit board or substrate. In some embodiments, a post-mounting processing step is performed on the shielded package.

In some implementations, a device having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 7:
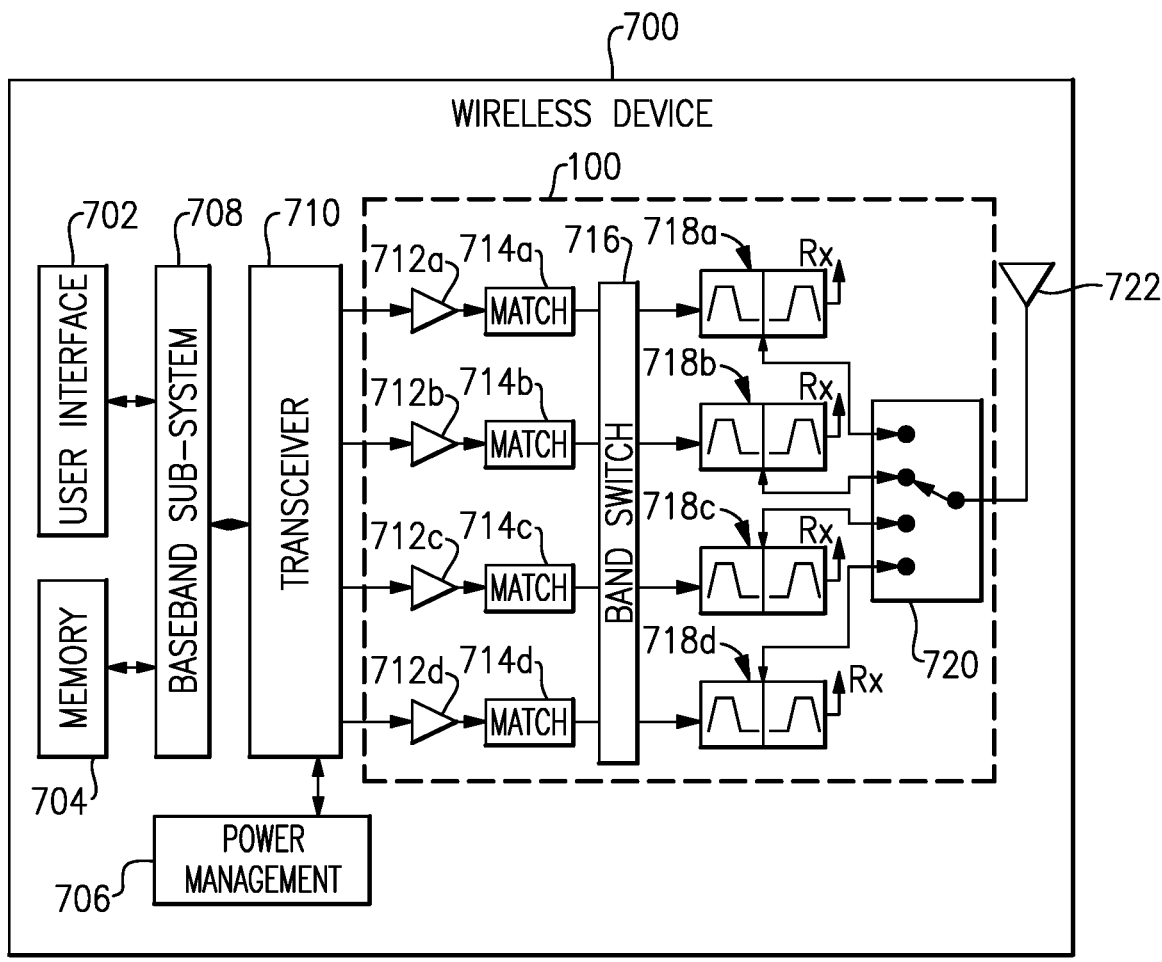
FIG. 7 depicts a wireless device that includes a shielded RF module having one or more advantageous features described herein

FIG. 7 depicts an example wireless device 700 having one or more advantageous features described herein. In the context of a module having one or more features as described herein with respect to an EMI-shielded semiconductor device such as device 200a of FIG. 2, such a module can be generally depicted by a dashed box 100, and can be implemented as a front-end module (FEM). Other modules in the wireless device 700 can also benefit from implementation of one or more features as described herein.

PAs 712 can receive their respective RF signals from a transceiver 710 that can be configured and operated to generate RF signals to be amplified and transmitted, and to process received signals. The transceiver 710 is shown to interact with a baseband sub-system 708 that is configured to provide conversion between data and/or voice signals suitable for a user and RF signals suitable for the transceiver 710. The transceiver 710 is also shown to be connected to a power management component 706 that is configured to manage power for the operation of the wireless device. Such power management can also control operations of the baseband sub-system 708 and the module 100.

The baseband sub-system 708 is shown to be connected to a user interface 702 to facilitate various input and output of voice and/or data provided to and received from the user. The baseband sub-system 708 can also be connected to a memory 704 that is configured to store data and/or instructions to facilitate the operation of the wireless device, and/or to provide storage of information for the user.

In the example wireless device 700, outputs of the PAs 712 are shown to be matched (via respective match circuits 714) and routed to an antenna 722 through a band selection switch 716, their respective duplexers 718 and an antenna switch 720. In some embodiments, each duplexer 718 can allow transmit and receive operations to be performed simultaneously using a common antenna (e.g., 722). In FIG. 7, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for providing electro-magnetic interference shielding for a radio-frequency module, the method comprising:
    applying a metal-based covering over a portion of a lead-frame package, the lead-frame package having a plurality of pins with at least one pin exposed from overmold compound and in contact with the metal-based covering, the applying the metal-based covering including spraying metallic paint on the lead-frame package;
    mounting the lead-frame package on a substrate; and
    connecting the metal-based covering to a ground plane of the substrate.

2. The method of claim 1 further comprising removing metal buildup of the metal-based covering from at least one section of one side of the lead-frame package.

3. The method of claim 1 further comprising performing a post-mounting processing step on the lead-frame package after mounting the lead-frame package on a substrate.

4. The method of claim 1 wherein connecting the metal-based covering to the ground plane includes soldering the at least one pin to a ground connection on the substrate.

5. The method of claim 1 wherein the portion of the lead-frame package covered by the metal-based covering includes all but one side of the lead-frame package.

6. The method of claim 1 wherein the metal-based covering includes two or more layers of metal.

7. The method of claim 6 wherein at least one layer of the two or more layers includes a first metallic composition that differs from a second metallic composition of another layer of the two or more layers.

8. The method of claim 1 wherein the lead-frame package includes a semiconductor die, and an inner row and an outer row of pins on each side, all the pins of all the outer rows of pins assigned to ground, none of the pins of the outer rows of pins electrically connected to the semiconductor die.

9. A method for providing electro-magnetic interference shielding for a radio-frequency module, the method comprising:
    applying a metal-based covering over a portion of a lead-frame package, the lead-frame package having a plurality of pins with at least one pin exposed from overmold compound and in contact with the metal-based covering;
    mounting the lead-frame package on a substrate;
    connecting the metal-based covering to a ground plane of the substrate; and
    removing metal buildup of the metal-based covering from at least one section of one side of the lead-frame package.

10. The method of claim 9 further comprising performing a post-mounting processing step on the lead-frame package after mounting the lead-frame package on a substrate.

11. The method of claim 9 wherein connecting the metal-based covering to the ground plane includes soldering the at least one pin to a ground connection on the substrate.

12. The method of claim 9 wherein the portion of the lead-frame package covered by the metal-based covering includes all but one side of the lead-frame package.

13. The method of claim 9 wherein the metal-based covering includes two or more layers of metal.

14. The method of claim 9 wherein the lead-frame package includes a semiconductor die, and an inner row and an outer row of pins on each side, all the pins of all the outer rows of pins assigned to ground, none of the pins of the outer rows of pins electrically connected to the semiconductor die.

15. A method for providing electro-magnetic interference shielding for a radio-frequency module, the method comprising:
    applying a metal-based covering over a portion of a lead-frame package, the lead-frame package having a plurality of pins with at least one pin exposed from overmold compound and in contact with the metal-based covering, the lead-frame package being a dual-row, quadrature, flat no-lead (QFN) chip package;
    mounting the lead-frame package on a substrate; and
    connecting the metal-based covering to a ground plane of the substrate.

16. The method of claim 15 further comprising removing metal buildup of the metal-based covering from at least one section of one side of the lead-frame package.

17. The method of claim 15 wherein applying the metal-based covering includes spraying metallic paint on the lead-frame package.

18. The method of claim 15 wherein the portion of the lead-frame package covered by the metal-based covering includes all but one side of the lead-frame package.

19. The method of claim 15 wherein the metal-based covering includes two or more layers of metal.

20. The method of claim 15 wherein the lead-frame package includes a semiconductor die, and an inner row and an outer row of pins on each side, all the pins of all the outer rows of pins assigned to ground, none of the pins of the outer rows of pins electrically connected to the semiconductor die.

* * * * *